United States Patent
Tracht et al.

(10) Patent No.: US 8,217,511 B2
(45) Date of Patent: Jul. 10, 2012

(54) REDISTRIBUTED CHIP PACKAGING WITH THERMAL CONTACT TO DEVICE BACKSIDE

(75) Inventors: Neil T. Tracht, Mesa, AZ (US); Darrel R Frear, Phoenix, AZ (US); James R. Griffiths, Chandler, AZ (US); Lizabeth Ann A. Keser, Chandler, AZ (US); Tien Yu T. Lee, Phoenix, AZ (US); Elie A. Maalouf, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 392 days.

(21) Appl. No.: 11/831,651

(22) Filed: Jul. 31, 2007

(65) Prior Publication Data
US 2009/0032933 A1  Feb. 5, 2009

(51) Int. Cl.
*H01L 23/10* (2006.01)

(52) U.S. Cl. . 257/707; 257/706; 257/693; 257/E23.173; 438/124

(58) Field of Classification Search .......... 257/678, 257/712, E21.499, E23.001, 720, 693, 700, 257/702, 706, 707, E23.06, E23.063, E23.067, 257/E23.106; 438/124; 361/704
See application file for complete search history.

(56) References Cited

U.S. PATENT DOCUMENTS

| | | | | |
|---|---|---|---|---|
| 5,909,058 A * | 6/1999 | Yano et al. | | 257/712 |
| 6,154,366 A * | 11/2000 | Ma et al. | | 361/704 |
| 6,392,290 B1 * | 5/2002 | Kasem et al. | | 257/678 |
| 6,838,776 B2 | 1/2005 | Leal et al. | | |
| 6,921,975 B2 | 7/2005 | Leal et al. | | |
| 2002/0038908 A1 * | 4/2002 | Ding et al. | | 257/720 |
| 2002/0070443 A1 * | 6/2002 | Mu et al. | | 257/712 |
| 2004/0124513 A1 * | 7/2004 | Ho et al. | | 257/678 |
| 2006/0180904 A1 | 8/2006 | Ong | | |
| 2008/0119015 A1 * | 5/2008 | Mangrum et al. | | 438/124 |

* cited by examiner

*Primary Examiner* — Matthew E Warren
*Assistant Examiner* — Fang-Xing Jiang
(74) *Attorney, Agent, or Firm* — Jackson Walker L.L.P.

(57) ABSTRACT

An integrated circuit assembly includes a panel including an semiconductor device at least partially surrounded by an encapsulant. A panel upper surface and a device active surface are substantially coplanar. The assembly further includes one or more interconnect layers overlying the panel upper surface. Each of the interconnect layers includes an insulating film having contacts formed therein an interconnect metallization formed thereon. A lower surface of the panel is substantially coplanar with either a backside of the device or a lower surface of a thermally and electrically conductive slab that has an upper surface in thermal contact with the device backside. The assembly may also include a set of panel vias. The panel vias are thermally and electrically conductive conduits extending through the panel between the interconnect layer and suitable for bonding with a land grid array (LGA) or other contact structure of an underlying circuit board.

11 Claims, 4 Drawing Sheets

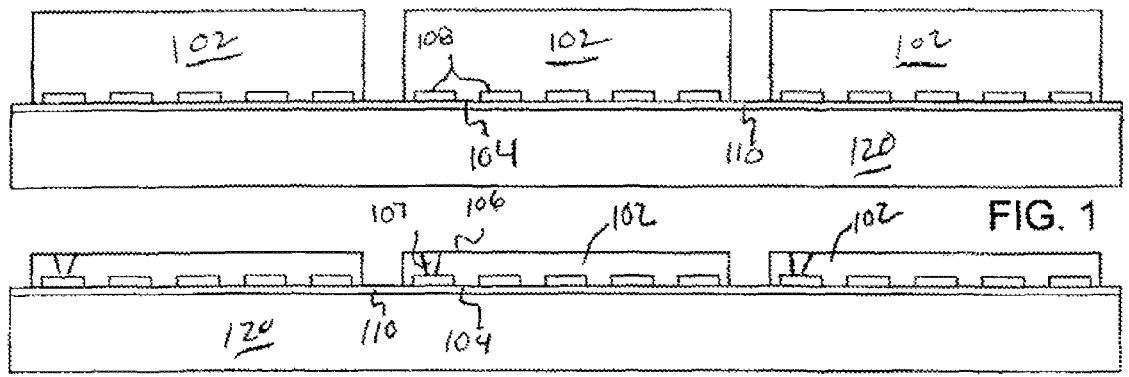
FIG. 1
FIG. 2
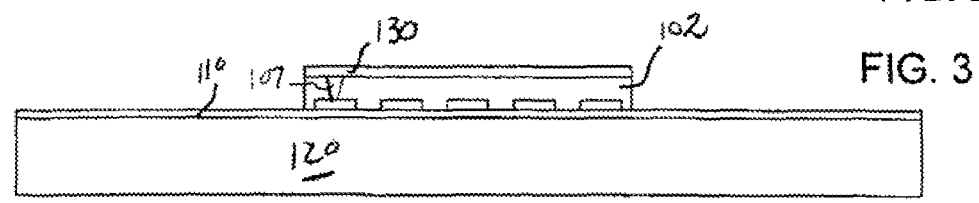
FIG. 3
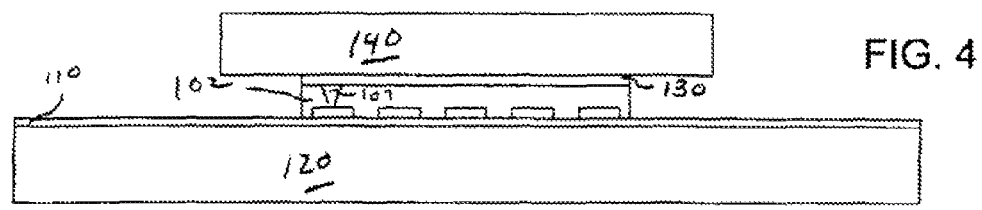
FIG. 4
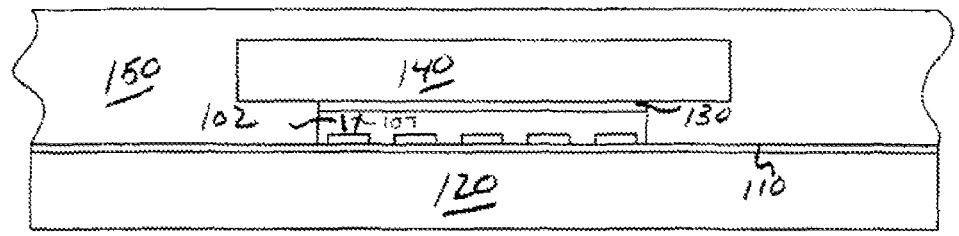
FIG. 5

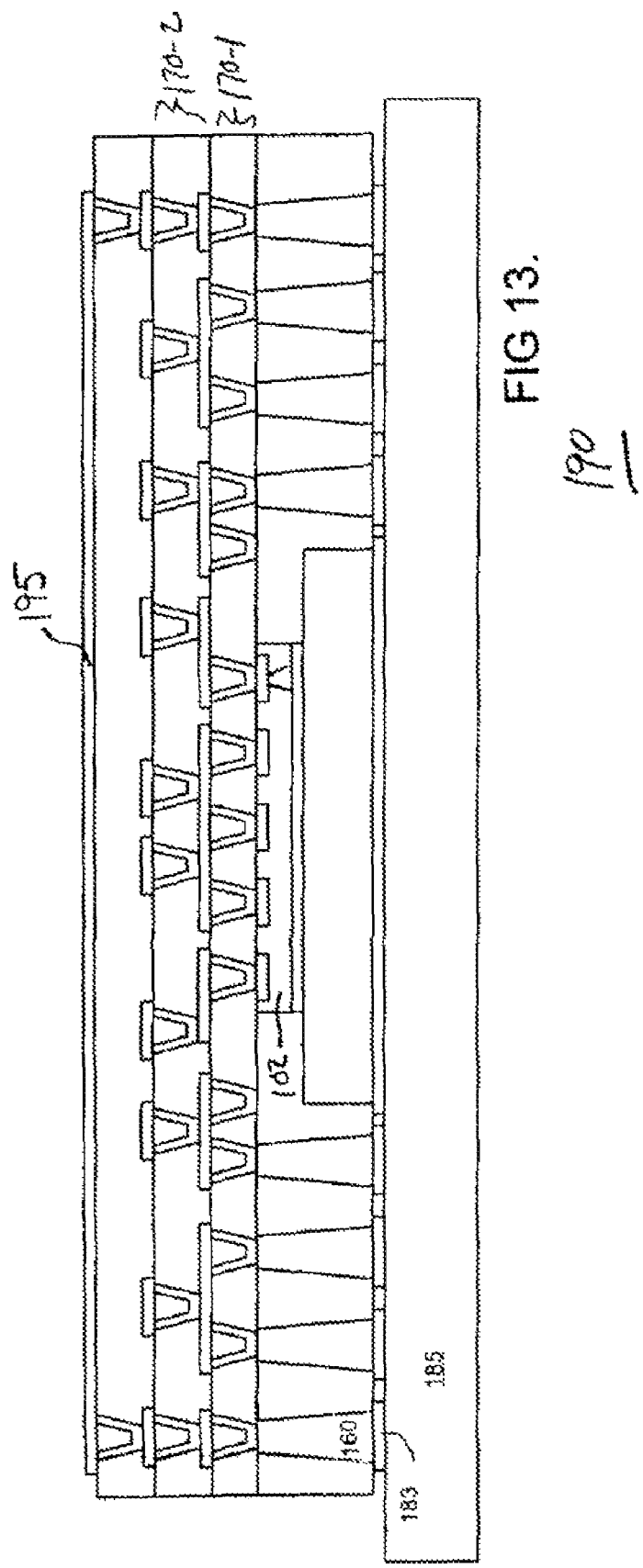

REDISTRIBUTED CHIP PACKAGING WITH THERMAL CONTACT TO DEVICE BACKSIDE

BACKGROUND

1. Field

This disclosure relates generally to integrated circuits and, more specifically, integrated circuit packaging.

2. Related Art

Two primary considerations in the field of integrated circuit packaging are packaging density and heat dissipation. Generally, it is desirable to use packaging technology that increases density, improves heat dissipation, or both. In conventional wirebond modules that employ one or more high density interconnect (HDI) layers, thermal dissipation is limited by the HDI layers. Redistributed Chip Packaging (RCP) offers improved density by eliminating the need for conventional wirebonds, but uses a "die down" configuration in which thermal energy dissipates through the topside of the die via a metal interconnect that overlies the die. See, e.g., U.S. Pat. No. 6,838,776 B2, to Leal et al. for Circuit Device with At Least Partial Packaging and Method for Forming, issued Jan. 4, 2005. Even when a heat spreader is used in conjunction with RCP, the interconnect layers present a heat dissipation bottleneck. The heat dissipation issues referred to are especially problematic for devices that generate substantial thermal energy including, for example, power amplifier devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a partial cross section of a plurality of devices overlying a carrier frame;

FIG. 2 is a subsequent view in which the devices have been thinned;

FIG. 3 is a subsequent view, showing only one of the devices, in which a heat spreader has been attached to the device backside;

FIG. 4 is a subsequent view in which a thermal slab is attached overlying the device backside;

FIG. 5 is a subsequent view in which an encapsulant is formed;

FIG. 13 depicts an embodiment in which a shielding layer of interconnect is formed overlying the assembly.

DETAILED DESCRIPTION

Figure 6:
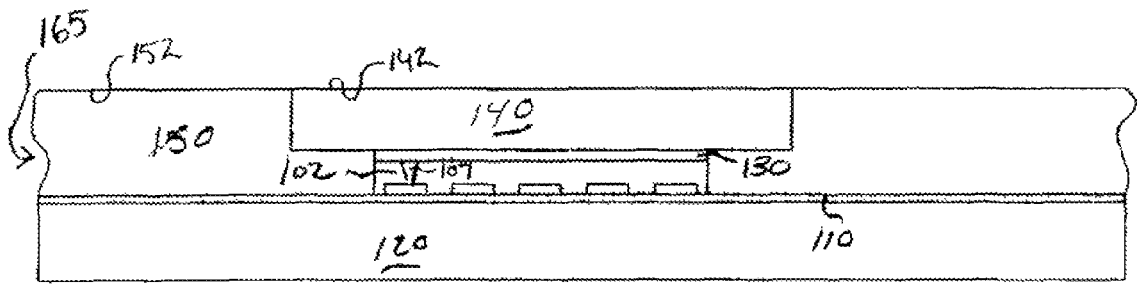
FIG. 6 is a subsequent view in which the encapsulant is planarized to the slab.

In one aspect, a disclosed integrated circuit assembly includes a printed circuit board (PCB), a panel overlying the PCB, and one or more interconnect layers overlying the panel. The panel includes a power amplifier or other device at least partially surrounded by an encapsulant. The device substrate and/or backside may include gallium arsenide, silicon, silicon carbide, or another semiconductor. The device is oriented within the encapsulant with the device's active surface coplanar with an upper surface of the panel. A backside of the device is in thermal contact and may be in electrical contact with either the circuit board or a thermal slab. In the case of the thermal slab, the slab has an upper surface in thermal contact with the device backside and a lower surface in thermal contact with the PCB. The interconnect layers include an insulating film, interconnect metallization overlying the insulating film, and electrically conductive contacts formed in and extending through the insulating film.

Some embodiments of the assembly include a set of panel vias formed in the panel encapsulant. The panel vias are electrically and thermally conductive metal vias that extend through the panel between the interconnect layers and the circuit board. The panel vias enable the elimination of wirebonds so that, in some embodiments, the panel does not include any wirebonds. In these embodiments, electrical connections between the device active surface and the circuit board traverse the panel vias and the interconnect metallization. External devices, packages, and/or modules may be attached to a bond pad overlying the topmost interconnect layer. The thermal contacts to the PCB may include thermal contacts to land grid array (LGA) pads of the PCB.

In another aspect, an integrated circuit assembly method includes forming a panel by mold injecting or otherwise forming an encapsulant at least partially surrounding a power amplifier or other integrated circuit device. An upper surface of the panel is substantially planer and includes an upper surface of the encapsulant substantially coplanar with an active surface of the device. A panel lower surface of the panel encapsulant is substantially coplanar with either a backside of the device or a lower surface of a thermally conductive slab.

A set of panel vias may be formed in the panel encapsulant. The thermal vias are electrically and thermally conductive contacts or conduits extending between an upper surface of the panel to a lower surface of the panel. At least one interconnect layer is formed overlying the panel. The interconnect layer includes an insulating film, contacts formed in the insulating film, and an interconnect metallization overlying the insulating film.

Prior to forming the panel, a portion of the device substrate may be grinded, polished, or otherwise removed to thin the device. Prior to forming the encapsulant, a thermal slab may be attached in thermal contact with the backside of the device with a lower surface of the panel substantially coplanar with a lower surface of the thermal slab. Prior to forming the encapsulant, the active surface of the device may be affixed to a carrier plate with an adhesive layer. The carrier plate and adhesive layer are then removed sometime after forming the encapsulant. The panel may be attached overlying a PCB where the panel lower surface is in close proximity to the PCB and the panel upper surface is distal from the PCB. Attaching the panel to the PCB may include attaching portions of the panel to land grid array (LGA) pads of the PCB. One or more external device may also be attached overlying an uppermost of the interconnect layers. A shielding metallization layer may be formed overlying an uppermost interconnect layer.

In still another aspect, a disclosed integrated circuit assembly includes a panel and an interconnect layer. The panel includes a power amplifier or other device at least partially surrounded by an encapsulant. The panel upper surface is substantially planar and includes an upper surface of the encapsulant and an active surface of the device. The interconnect layer overlies the upper surface of the panel and includes including an insulating film having contacts formed therein an interconnect metallization formed thereon. A lower surface of the panel is substantially planar and includes a lower surface of the encapsulant and one of either the device backside or a lower surface of a thermally and electrically conductive slab. In the case of the slab, an upper surface of the slab is in thermal contact with the backside of the device. The assembly may further include a set of panel vias. The panel vias comprise thermal and electrical conduits extending through the panel and suitable for make electrical connection between the interconnect layer and a pad or other bonding structure of an underlying PCB.

The disclosed embodiments of the integrated circuit assembly offer improved thermal and electrical paths to ground that result in lower junction temperatures compared to conventional wirebond modules or prior RCP solutions. Thermal modeling shows that junctions temperatures for a typical power amplifier device exceed 150 C with conventional RCP assembly. By improving thermal dissipation, the disclosed assemblies will enable power amplifiers and other high power devices to take advantage of the integration and cost benefits of RCP technology.

Turning now to the drawings, FIG. 1 is a cross sectional view of a semiconductor device 102 at a selected stage in one embodiment of an assembly process. As depicted in FIG. 1, three units of integrated circuits 102 are shown. Each unit of semiconductor device 102 includes an active surface 104, also referred to herein as active side 104, and a back surface or backside 106. Active surface 104 represents, as its name suggests the surface that is proximal to the transistors and other devices within semiconductor device 102. The active surface 104 as shown in FIG. 1 includes one or more contact pads 108 that provide externally accessible connections to selected nodes of the circuitry (not depicted) within semiconductor device 102. Contact pads 108 are electrically conductive elements that may include tin, tin lead, gold, sliver, aluminum, any combination thereof, or any other suitable conductive material.

As shown in FIG. 1, a group of integrated circuits 102 overlie a carrier plate 120. While some of the stages shown in the drawings illustrate a group of integrated circuits 102, other stages illustrate a single semiconductor device 102 for the sake of clarity and simplicity. Processing represented by the illustrated stages may, in some cases, be performed at a wafer level, a "panel level" with multiple individual integrated circuits being attached to a carrier plate such as carrier plate 120 or a lead frame, while still other stages may be performed at a die level, on individual integrated circuits 102.

As shown in FIG. 1, semiconductor device 102 is oriented with respect to carrier plate 120 wherein active surface 104 of semiconductor device 102 is proximal to carrier plate 120 and backside 106 is distal from carrier plate 102. An adhesive layer 110 is shown positioned between active surface 104 of semiconductor device 102 and carrier plate 120. Adhesive layer 110 has an adhesive on both of its major surfaces, analogous to double-side tape, to maintain integrated circuits 102 overlying carrier plate 120.

Referring to FIG. 2, an optional device thinning operation has been performed to reduce the thickness of semiconductor device 102 and one or more through vias 107 have been formed as well. As shown in FIG. 2, the displacement between backside 106 of semiconductor device 102 and active layer 104 is less than it was as shown in FIG. 1. Thinning of semiconductor device 102 may be achieved with conventional grinding, polishing, and/or etching techniques well known in the field of semiconductor processing. In some embodiments, semiconductor device 102 as shown in FIG. 1 may have a thickness of approximately 0.50 mm while semiconductor device 102, after the thinning operation as shown in FIG. 2, may have a thickness in the range of approximately 0.05 to 0.20 mm. Through vias 107, as their name suggests, extend through the wafer substrate and enable an electrical connection to be made to an element such as a circuit board, external device, or the like that is in proximity.

Referring to FIG. 3, a thermal paste 130 is depicted overlying backside 106 of semiconductor device 102. In some embodiments, thermal paste 130 is a thermally and electrically conductive compound that improves heat dissipation from semiconductor device 102 by filling air gaps that would otherwise exist between semiconductor device 102 and a subsequently attached heat dissipation piece. In some embodiments, thermal paste 130 is epoxy based. In other embodiments, ceramic, or metal based thermal pastes may be used.

Referring to FIG. 4, an optional thermal slab 140 is shown positioned overlying semiconductor device 102 and thermal paste 130. Thermal slab 140 facilitates heat dissipation from the backside of semiconductor device 102. In some embodiments, thermal slab 140 is a substantially homogenous and uniform block of a thermally and electrically conductive material such as copper, aluminum, or the like. In other embodiments, thermal slab 140 may be a leadframe based heat spreader.

The thickness and material of thermal slab 140 is an implementation detail. In some embodiments, the thickness of thermal slab 140 is designed in conjunction with the thickness of semiconductor device 102 to produce a desired overall thickness. For example, in some embodiments the combined thickness of semiconductor device 102 and thermal slab 140 is approximately 0.200 mm, which might include a semiconductor device 102 with an approximately thickness of 0.075 mm and a thermal slab with a thickness of approximately 0.125 mm. In another 0.200 mm embodiment, thermal slab 140 is eliminated and semiconductor device 102 has a thickness of approximately 0.150 to 0.200 mm. In still other embodiments, the combined thickness of semiconductor device 102 and thermal slab 140 is approximately 0.500 mm. An implementation of this embodiment may employ an integrated circuit thickness of approximately 0.075 mm and a thermal slab thickness of approximately 0.425 mm. Other embodiments may employ thinner or thicker integrated circuits and/or thermal slabs.

Referring to FIG. 5, an encapsulant 150 is formed to encapsulate semiconductor device 102 and thermal slab 140. In some embodiments, encapsulant 150 is an electrically nonconductive material that can be molded including, as examples, thermoset mold compounds or filled thermoplastic resins. In other embodiments, encapsulant 150 may be an electrically conductive material that can be molded, e.g., a thermoset epoxy or thermoplastic with a metallic filler. In some embodiments, the formation of encapsulant 150 includes an injection molding process in which a cast or set (not depicted) is positioned overlying the assembly and the encapsulant material is injected into the cast. The encapsulant is then cured with heat and the cast is removed.

Referring to FIG. 6, a planarizing process has been performed to make an upper surface 152 of encapsulant 150 substantially co-planar with an upper surface 142 of thermal slab 140. As depicted in FIG. 5, encapsulant 150 as formed is thicker than the combined thickness of semiconductor device 102 and thermal slab 140. The planarizing process of FIG. 6 removes portions of encapsulant 150 above upper surface 142 of thermal slab 140. In different embodiments, the planarizing process may include known polishing, etchback, and/or grinding techniques. The combination of the encapsulant 150 and the elements surrounded by it including semiconductor device 102 and, in some embodiments, thermal slab 140, are collectively referred to herein as panel 165.

Figure 7:
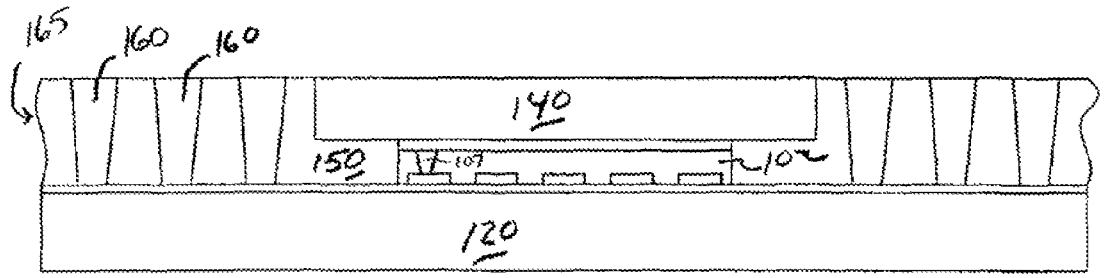
FIG. 7 is a subsequent view in which the assembly is flipped and vias are formed in the encapsulant.

Referring to FIG. 7, panel vias 160 have been formed in encapsulant 150 of panel 165. In some embodiments, panel vias 160 facilitate thermal control of semiconductor device 102 by providing additional heat dissipation paths while simultaneously providing electrical connections between interconnect layers above and below the assembly. The formation of panel vias 160 includes a via opening processing and a via fill process. The via opening process may include a laser drilling process and/or a photo/etch process to produce vias that extend entirely or substantially entirely through encapsulant 150. The vias are then filled with thermally and electrically conductive material such as copper, aluminum, alloys thereof, and the like. The filling of panel vias 160 with the electrically conductive material may include one or more conventional physical and/or chemical vapor deposition steps.

Figure 8:
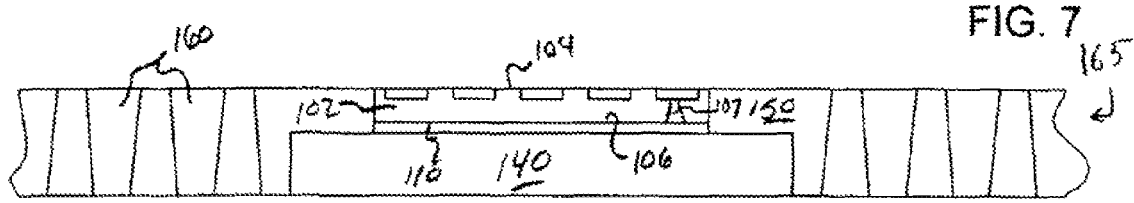
FIG. 8 is a subsequent view in which the carrier plate is removed.

Referring to FIG. 8, carrier plate 120 and adhesive 130 are removed from the panel 165, which includes semiconductor device 102, thermal slab 140, and encapsulant 150. As seen in FIG. 8, the orientation of slab 165 is rotated 180 degrees from the orientation shown in FIG. 7 so that semiconductor device 102 as shown in FIG. 8 overlies thermal slab 140. The orientation shown in FIG. 8 reflects embodiments in which panel 165 is affixed to an underlying board, e.g., a printed circuit board, with thermal slab 140 in contact with or in close proximity to the circuit board. In embodiments that do not include a thermal slab, the backside 106 of semiconductor device 102 will be in contact with or in close proximity to the circuit board.

Figure 9:
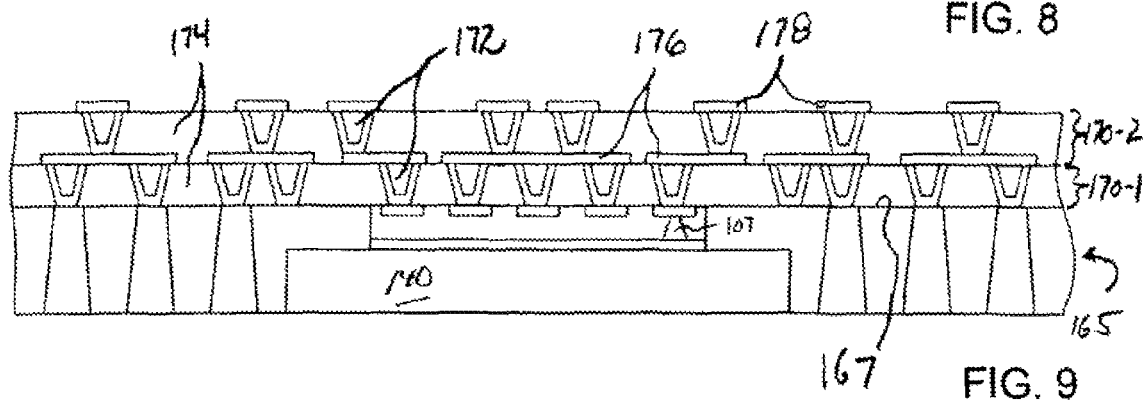
FIG. 9 is a subsequent view in which interconnect layers are formed overlying the device.

Referring to FIG. 9, one or more interconnect layers are formed overlying upper surface 167 of panel 165. As shown in FIG. 9, for example, two interconnect layers 170-1 and 170-2 (generically or collectively referred to herein as interconnect layer(s) 170) are shown. Each interconnect layer 170 includes a insulating film 174, which may include a CVD dielectric, a spin on glass, a spin on polymer, or another suitable electrical insulator, that is bonded to or otherwise formed overlying panel 165. Contacts 172 are formed in insulating film 174 and interconnect metallization 176 is formed overlying insulating film 174 using, for example, laser ablation to form contact holes and sputter deposition and conventional lithography to form the metallization. Bonding pads 178 are formed overlying the top interconnect layer, which is interconnect layer 170-2 as shown in FIG. 9. Bonding pads 178 are preferably suitable for bonding with an external device as illustrated below. Although FIG. 9 illustrates two interconnect layers 170, other embodiments may have more or fewer interconnect layers.

Figure 10:
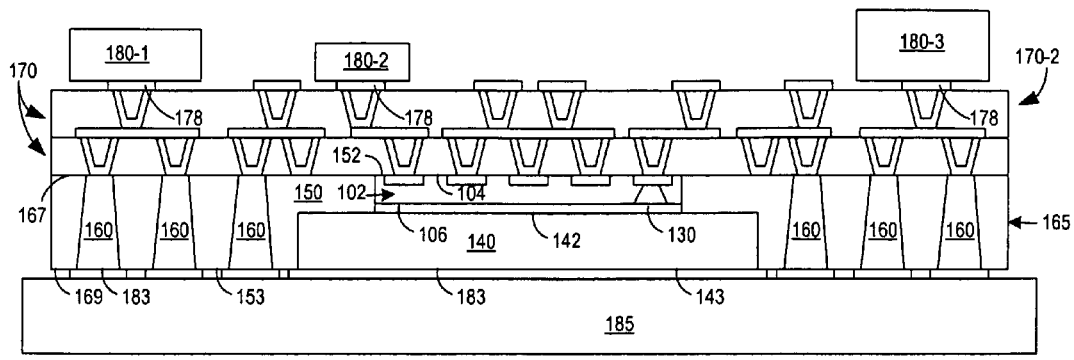
FIG. 10 is a subsequent view in which the assembly is attached overlying a board and external devices are attached overlying the interconnect layers.

Referring now to FIG. 10, optional external devices 180-1 through 180-3 are attached to respective bonding pads 178 and panel 165 has been attached to land grid array (LGA) pads 183 of a printed circuit board (PCB) 185 to form an integrated circuit assembly 190. External devices 180-1 through 180-3 may include single-die packages, multi-chip modules, or a combination thereof. Thus, as shown in FIG. 10, integrated circuit assembly 190 includes panel 165 overlying PCB 185. Panel 165 as shown includes semiconductor device 102 at least partially surrounded by encapsulant 150. Upper surface 167 of panel 165 as shown is substantially planar and includes upper surface 152 of encapsulant 150 and active surface 104 of semiconductor device 102. Device 102 is oriented as depicted in FIG. 10 with its backside 106 underlying its active side 104 so that backside 106 is closer to board 185 than active side 104. As depicted in FIG. 10, integrated circuit assembly includes thermal slab 140 overlying and in contact with an LGA pad 183 of board 185 and backside 106 of semiconductor device 102 in thermal contact, via thermal paste 130 with thermal slab 140.

One or more layers of interconnect 170 overlie panel 165. External devices 180-1 through 180-3 are attached overlying a top most interconnect layer 170-2. A set of vias 160 formed in the encapsulant 150 of panel 165 provide electrical and thermal conduits between interconnect layers 170 and board 185.

In some embodiments, device 102 is characterized as a high power device, such as a power amplifier, that generates substantial thermal energy. By providing a thermal/electrical contact between the backside 106 of device 102 and the board 165, integrated circuit assembly 190 as shown facilitates thermal management of high power devices using a packaging configuration that desirably eliminates wirebonds to minimize the dimensions of the assembly. In addition to orienting the high power device 102 with its backside 106 proximal to board 185, integrated circuit assembly 190 as shown further includes a thermal slab 140 having an upper surface 142 in thermal contact with device 102 to facilitate the dissipation of thermal energy produced by device 102. For purposes of this disclosure, the term thermal contact includes physical contact as well as contact through a thermal intermediary such as thermal paste 130. In this embodiment, a lower surface 169 of panel 165 is planar and is comprised of a lower surface 153 of encapsulant 150 being substantially coplanar with a lower surface 143 of thermal slab 140.

In addition, integrated circuit assembly 190 as shown in FIG. 10 further facilitates thermal management with the set of thermal vias 160 formed in encapsulant 150 of panel 165 and forming electrical and thermal conduits between the overlying interconnect layers 170 and the underlying PCB 185.

Figure 11:
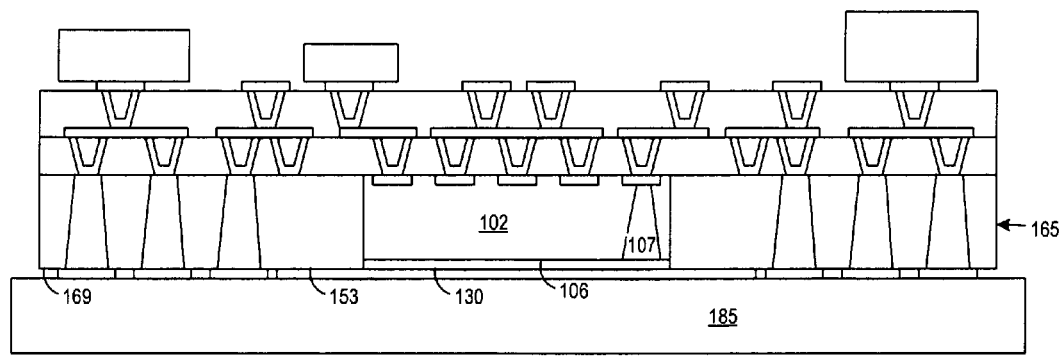
FIG. 11 is an embodiment alternative to the embodiment shown in FIG. 10 in which a thicker device, without a thermal slab, is used in lieu of the device and slab shown in FIG. 10.
Figure 12:
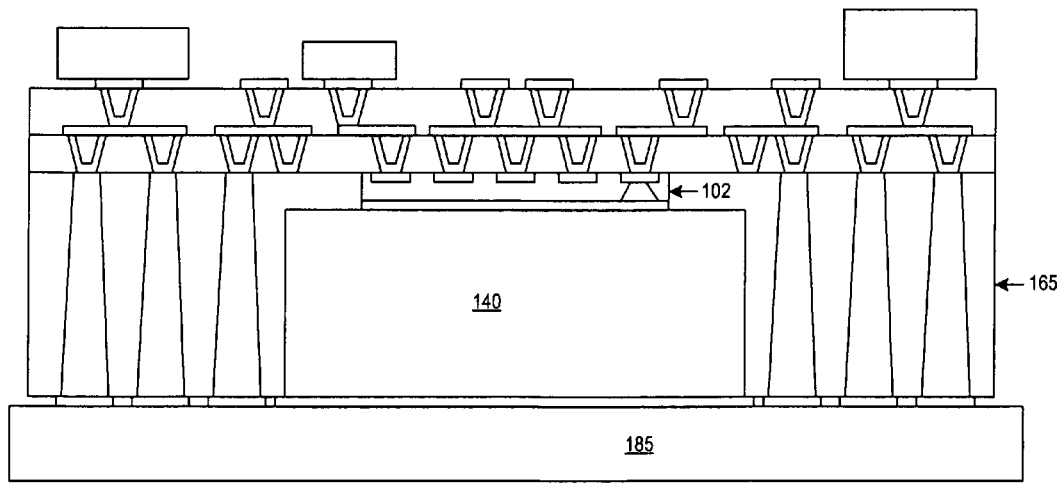
FIG. 12 is an embodiment alternative to the embodiment shown in FIG. 10 in which a device is used with a thicker thermal slab.

FIG. 11 and FIG. 12 show alternative implementations of integrated circuit assembly 190. In the embodiment of FIG. 11, integrated circuit assembly 190 employs a thicker die 102 and eliminates thermal slab 140 so that backside 106 of semiconductor device 102 is in thermal contact with LGA pads 183 of PCB 185. In this embodiment, the panel lower surface includes the encapsulant lower surface 153 and device backside 106 and/or thermal paste 130. In the embodiment depicted in FIG. 12, the thinner device 102 of FIG. 10 is used in conjunction with a thicker thermal slab 140 for use in a thicker panel 165 that may be designed to accommodate other thicker devices (not shown) in panel 165. Although three examples of integrated circuit assembly 190 have been specifically illustrated, other embodiments may employ thicker or thinner devices 102 and thicker or thinner panels 165 with or without thermal slab 140.

Referring now to FIG. 13, an embodiment of integrated circuit assembly 190 suitable for use with RF applications is shown. Integrated circuit assembly 190 as shown in FIG. 13 includes a shielding metallization layer 195 that overlies the interconnect layers 170. Shielding metallization layer 195 is a top-most metallization layer that provides RF shielding for the underlying device 102. Shielding matellization layer 195 is, in some embodiments, an uninterrupted or substantially uninterrupted sheet of interconnect metallization. As seen in FIG. 13, the shielding metallization layer 195 may be connected to LGA pads 183 of board 185 through thermal vias 160 and interconnect levels 170. Presumably, the LGA pads 183 to which shielding metallization layer 195 is connect are ground pads or other static voltage pads.

Although the invention is described herein with reference to specific embodiments, various modifications and changes can be made without departing from the scope of the present invention as set forth in the claims below. For example, although the depicted embodiment of board 185 uses LGA pads 183, other embodiments may employ ball grid or other types of pads. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit assembly, comprising:
   a printed circuit board (PCB);
   a panel including:
      a layer of an encapsulating material, the layer having an upper surface coplanar with an upper surface of the panel and a lower surface coplanar with a lower surface of the panel and wherein the lower surface of the encapsulating layer is in contact with the PCB;
      a device embedded in the encapsulating material wherein an active surface of the device and the upper surface of the layer of encapsulating material are coplanar;
      a thermally and electrically conductive slab, wherein an upper surface of the slab is in thermal contact with a backside of the device and a lower surface of the slab is coplanar with the lower surface of the panel and wherein the lower surface of the thermally and electrically conductive slab is in thermal contact with the PCB;
      an electrically and thermally conductive panel via, embedded in the encapsulating material, laterally displaced from the device within the layer of encapsulating material, and extending from the upper surface of the layer of encapsulating material to the lower surface of the encapsulating layer; and
      an interconnect layer overlying the upper surface of the panel wherein said interconnect layer includes an insulating film having contacts formed therein and interconnect metallization formed thereon.

2. The integrated circuit assembly of claim 1, wherein the assembly lacks wirebonds and wherein an electrical connection between the active surface of the device and an underlying circuit board traverses the interconnect metallization and the panel via.

3. The integrated circuit assembly of claim 1, further comprising an external device attached to a bond pad overlying a topmost interconnect layer wherein the external device is in electrical contact with an underlying circuit board through the interconnect layers and the panel via.

4. The integrated circuit assembly of claim 1, wherein the slab comprises a substantially uniform and continuous metal.

5. The integrated circuit assembly of claim 1, wherein the device is a power amplifier device including a gallium arsenide device substrate.

6. The integrated circuit assembly of claim 1, wherein the device is a power amplifier device including a substrate having a silicon carbide layer overlying a silicon layer.

7. The integrated circuit assembly of claim 1, further comprising a thermal paste positioned between the backside of the integrated circuit device and the upper surface of the thermal slab.

8. The integrated circuit assembly of claim 1, wherein the encapsulating material is a moldable, electrically non-conductive material.

9. The integrated circuit of claim 8, wherein the encapsulating material is selected from a thermoset mold compound and a filled thermoplastic resin.

10. The integrated circuit assembly of claim 1, wherein the encapsulating material is selected from a thermoset epoxy and a thermoplastic with a metallic filler.

11. The integrated circuit assembly of claim 1, wherein the layer of encapsulating material is an injection molded layer.

* * * * *